United States Patent [19]
Larson et al.

[11] Patent Number: 5,472,043
[45] Date of Patent: Dec. 5, 1995

[54] TWO-PHASE COMPONENT COOLER WITH RADIOACTIVE INITIATOR

[75] Inventors: Ralph I. Larson, Bolton, Mass.; Richard L. Phillips, Alachua, Fla.

[73] Assignee: Aavid Laboratories, Inc., South Lancaster, Mass.

[21] Appl. No.: 216,483

[22] Filed: Mar. 22, 1994

[51] Int. Cl.⁶ ........................... F28D 15/00
[52] U.S. Cl. .................. 165/104.21; 165/104.33; 257/715; 361/700
[58] Field of Search ................... 257/714, 715; 361/710, 711, 712, 713, 714, 715; 165/104.33

[56] References Cited

U.S. PATENT DOCUMENTS

| | | | |
|---|---|---|---|
| 3,638,023 | 1/1972 | Cottam et al. | 165/104.26 |
| 3,866,424 | 2/1975 | Busey | 165/104.21 |
| 3,952,797 | 4/1976 | Voboril et al. | 257/715 |
| 4,730,663 | 3/1988 | Völkl et al. | 165/104.19 |
| 5,000,256 | 3/1991 | Tousignant | 165/104.33 |
| 5,099,908 | 3/1992 | Taraci et al. | 165/104.33 |
| 5,161,087 | 11/1992 | Frankeny et al. | 361/710 |
| 5,206,791 | 4/1993 | Novotny | 257/715 |

*Primary Examiner*—John Rivell
*Assistant Examiner*—Christopher Atkinson
*Attorney, Agent, or Firm*—Bookstein & Kudirka

[57] ABSTRACT

A two-phase cooling apparatus uses a radioactive initiator to induce boiling in a liquid coolant, thus reducing thermal hysteresis. A radioactive source, such as spent uranium, is immersed in a liquid coolant bath to allow interaction between the emitted radiation and the liquid. A heat spreader plate may be used to conduct heat to the liquid from a unit to be cooled. An interior surface of a coolant chamber, such as the heat spreader plate, may be plated with a radioactive material to induce a high incidence of nucleation sites. A shielding material may also be used to shield the unit being cooled from the radioactive source. The radioactive source material may also be used to retrofit existing two-phase cooling systems.

47 Claims, 5 Drawing Sheets

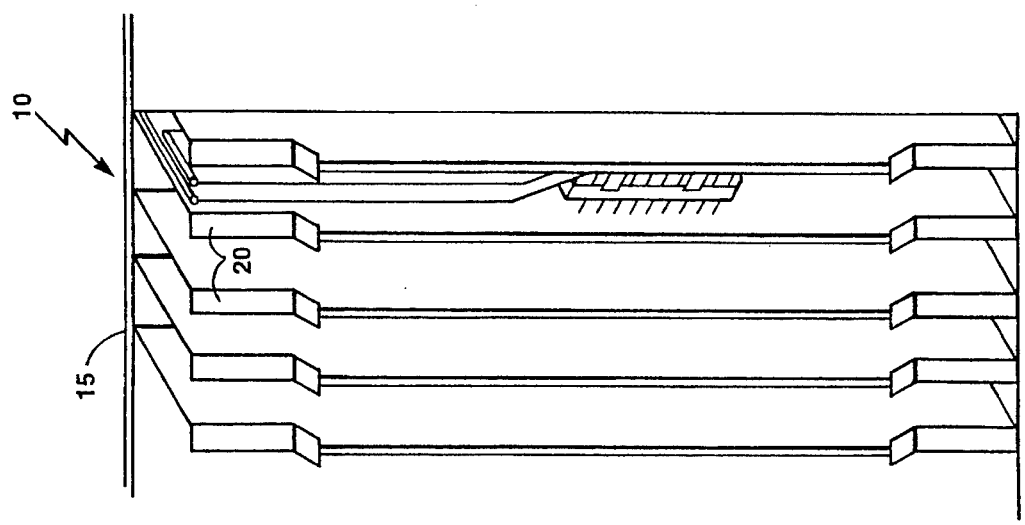
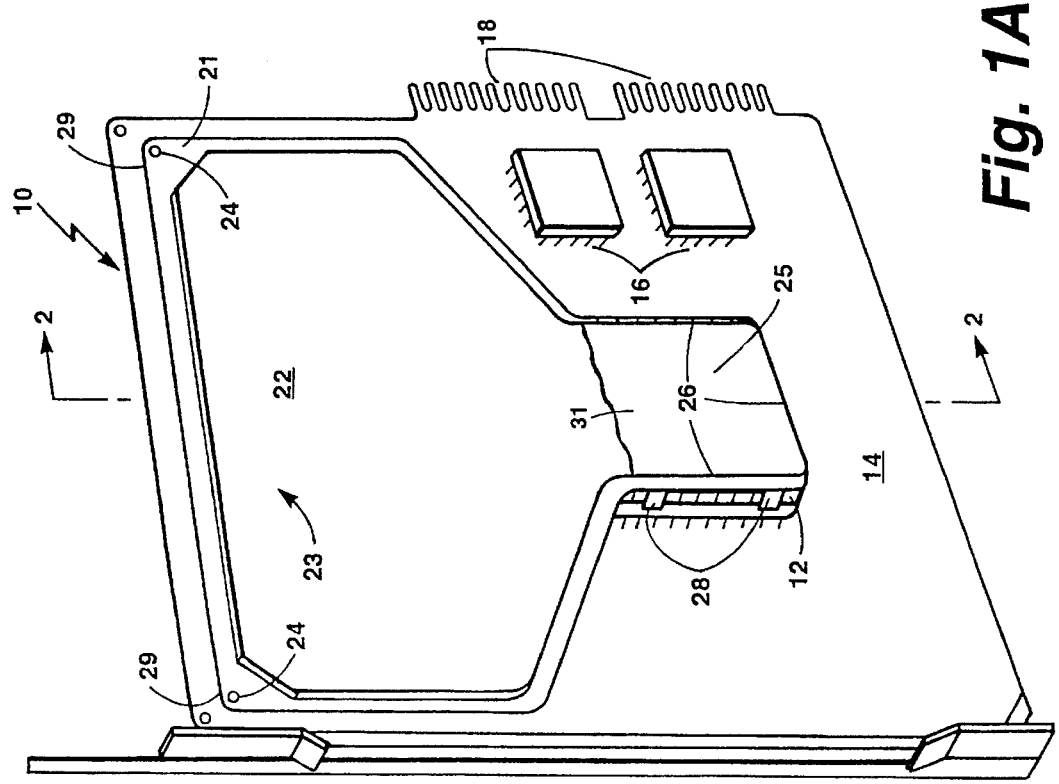

TWO-PHASE COMPONENT COOLER WITH RADIOACTIVE INITIATOR

BACKGROUND OF THE INVENTION

Traditional methods of cooling electronic systems, such as computers, have most commonly involved air as the heat transfer medium within the system. In such systems, heat generated by electronic components is typically transferred to the air surrounding the components and then to an ultimate sink, generally the room in which the electronic system is located. Heat transfer between the components and the surrounding air may be enhanced by increasing the surface area of contact between the electronic components and the air, for example, by using a heat sink, which itself may have fins to further increase the surface area available for heat transfer. Air circulation within the system may occur by natural convection or may be further enhanced by forcing the air to circulate about the components by means of a fan or blower.

As electronic equipment has become more sophisticated and yet more compact in size, the density of the heat-dissipating components mounted on a particular circuit board has necessarily increased. This is also true of the integrated circuit packages themselves, with the number and density of active devices, such as transistors, within a given package steadily increasing over time.

Unfortunately, these trends of increasing complexity and decreasing size have meant that the amount of heat dissipated within a given volume has also increased. With current-day integrated circuit technologies, the time is fast approaching when conventional air convection cooling methods, even those using forced air circulation with large heat sinks, will not adequately maintain certain high density integrated circuit packages within their permissible operating temperature range.

Consider, for example, the Pentium™ series of microprocessor chips recently introduced by Intel Corporation of Santa Clara, Calif. Depending on its operating speed, a Pentium™ P-5 chip typically dissipates on the order of 15 watts in a package which has less than two square inches of surface area, and a Pentium™ P-6 chip dissipates from 22 to 30 watts. Other microprocessor chips, such as the Alpha™ microprocessor recently introduced by Digital Equipment Corporation of Maynard, Mass. are projected to produce heat dissipations of 25 watts or higher in the same two square inches in their highest speed versions. If conventional air convection cooling techniques are to be used, such chips would require a very high air flow rates over finned heat sinks in order to maintain the chips in their desired operating temperature range.

Although such forced air cooling requirements are technically feasible, practical considerations rule out their use in current day personal computer applications. One reason is that the blowers or fans necessary to generate such a high air flow rate would necessarily create an unacceptable noise level in an operating environment such as an office which is expected to remain relatively quiet. This problem is further exacerbated in applications such as laptop and notebook computers, where the additional noise and weight of a forced air cooling system is simply neither practical nor desired.

Consequently, there has been renewed interest in adapting liquid cooling techniques to the problem of cooling high-powered integrated circuits. These techniques generally fall into two broad groups, single-phase and two-phase cooling systems. In a single-phase liquid cooling system, the coolant remains in the liquid phase over the normal and expected system operating temperature range. In a two-phase system, the coolant changes from the liquid phase to the vapor phase during at least one point in the normal operating temperature range.

One example of a single-phase liquid cooling system makes use of a hermetic enclosure filled with a high-boiling point liquid coolant which completely encloses the heat generating component. The enclosure may also be provided with external fins. Heat is transferred from the heat dissipating component to the liquid coolant by conduction and from the coolant to the walls of the enclosure by natural convection. The enclosure itself may further be cooled by circulating air around it. Such a cooling method can be effective, but involves other problems such as chemical incompatibilities between the component and the coolant over the long-term, and the difficulty of obtaining access to the component for maintenance.

Other single-phase systems do not directly immerse the integrated circuit component in the liquid, but instead confine just the coolant to a container which is then placed in intimate contact with the component. Heat is thus conducted from the component through the container wall into the liquid, which then dissipates the heat by natural convection.

One embodiment of the latter single-phase system uses a container in the form of a sealed flexible bag which is completely filled with a liquid coolant. The bag is typically constructed from a flexible plastic film which is relatively impermeable to both the air and the enclosed liquid. Metal inserts or thermal vias, which pass through the wall of the bag, may also be used with this type of system to more efficiently conduct the heat from the component to the coolant. Examples of such coolant bag systems are shown in U.S. Pat. Nos. 4,997,032 and 5,000,256.

While such single-phase bag systems can be useful in certain situations, they have several disadvantages. Because they use a single-phase coolant, the available heat transfer rate is still relatively low. Consequently, they cannot typically be used with the high heat dissipating electronic components such as microprocessors. In addition, the bags have a relatively large volume which conflicts with the current trend of reducing system size as much as possible, and thus single-phase bag systems have not found widespread practical application.

Two-phase liquid cooling systems have increasingly been used to overcome the limitations associated with single-phase systems. In a two-phase system, as the component heats up, a liquid coolant is vaporized. The vapor then travels to a condenser section of the system, where the coolant vapor is converted back into a liquid. The liquid is returned by some means to the heat dissituating component and the boiling and condensing cycle is continuous.

Such a two-phase device is shown in U.S. Pat. No. 3,741,292. In that system, the heat dissipating component is placed within a hermetic enclosure and directly immersed in a pool of low boiling point, dielectric liquid coolant. The heat dissipated by the component causes the liquid to boil, and the resulting vapor is collected in an enclosure space located above the liquid pool. The enclosure space is filled with inwardly extending fins which serve as a condenser for the coolant vapor. As the vapor condenses, it runs back into the liquid pool under the influence of gravity.

Other two-phase cooling systems, so called heat pipe systems, do not directly immerse the component in the coolant. Such a system consists of an elongated hermetic container having walls made with a thermally conductive material such as copper. One end of the container acts as an evaporator and the other end acts as a condenser. A wick or other capillary device, such as a fine mesh screen, extends along the interior of the container. During manufacture of the heat pipe, the container is partially filled with liquid coolant, and an) residual, non condensing gases, such as air, are purged, and the container is then sealed. The heat dissipating component is mounted to the evaporator end of the pipe, and heat is transferred by conduction through the container wall. As the coolant evaporates, or boils, the resulting vapor travels through the container to the other end where it condenses back to a liquid. The liquid is then returned to the evaporator end by means of the wick.

Although the direct immersion and heat pipe techniques can transfer heat away from the heat dissipating component quite efficiently, they also have their limitations. More specifically, both techniques use rigid, hermetically sealed containers. When the ambient temperature changes, the pressure inside the container changes, with a consequent change in the boiling point of the coolant. In addition, because the container is evacuated, there exists a significant pressure differential across the walls of the container. As the container is exposed to repeated heating and cooling cycles, the repeated change in pressure differential causes the walls of the container to flex. Eventually, the container fatigues, causing small leaks. When a leak does occur, air is drawn into the container. Later, when the component is then reactivated, the presence of air increases the pressure inside the container and may cause some of the liquid to be driven out of the container, thereby compromising the cooling capability of the device. Consequently, such devices are typically not considered to be useful in environments where long-term, low-maintenance operation is required.

Furthermore, the increase in internal pressure results in an increase in the coolant boiling point, which may also be altered by the presence of any residual air introduced into the system by leaks. Such devices thus cannot be expected to have a single predictable boiling temperature.

Prior art two-phase systems are also prone to a phenomenon called thermal hysteresis, or "overshoot". This occurs during device warmup as a result of the fact that the coolant may not begin to boil when the device temperature initially reaches the nominal boiling point. Instead, the tendency is for the temperature to continue to increase past the boiling point, and then for boiling to suddenly erupt. Once coolant boiling finally does occur, the device temperature returns to its normal operating range. However, in the interim, the system has been temporarily subjected to a temperature well above the boiling point. Overshoot is a highly undesirable condition as it stresses the components being cooled and in some cases may even cause them to temporarily operate; outside their expected temperature range.

A detailed analysis of thermal hysteresis is provided by Bar-Cohen in *Hysteresis Phenomena at the Onset of Nucleate Boiling*. The full extent of the phenomenon is discussed along with some approaches shown to alleviate the problem.

SUMMARY OF THE INVENTION

The invention is a two-phase cooling apparatus that uses a radioactive source which emits radiation that interacts with the liquid to initiate boiling. Typically, the liquid is a low boiling point liquid such as a fully perfluorinated fluorocarbon. In one embodiment the coolant is located in a flexible sealed bag, while in another the coolant moves between an evaporator unit which is separate from and in fluid connection with a condenser unit. A heat spreader plate may be used to provide a thermal conduction path to the liquid from the unit to be cooled. The plate may be submerged in the liquid and comprise an array of fins to provide a large surface area contacted by the liquid. In one embodiment the radioactive source is rigidly secured to the heat spreader plate, by wedging pellets of radioactive material between the fins of the plate.

One preferred radioactive source is spent uranium, which is comprised primarily of uranium-238. In such a case the radioactive source emits alpha radiation which interacts with the liquid to induce the formation of boiling nucleation sites. A number of sources of radioactive material may be distributed throughout the enclosed region to provide the best possible coverage. Preferably, the sources are spaced apart from one another but all submerged within the coolant liquid.

In another embodiment, the radioactive material is plated directly on an inner surface of the enclosed region. By plating the material such as spent uranium onto the surface of a heat spreader plate or elsewhere in the interior of an evaporator, a high degree of interaction between the emitted radiation and the coolant liquid occurs directly at the surface where the liquid is heated, thus causing a high incidence of nucleation site formation.

Other embodiments involve the combination of the radioactive source initiators with other techniques for the formation of nucleation sites. These techniques include, but are not limited to, the use of pitted inner surfaces and the intermixing of residual gases such as air which diffuse into the coolant liquid. The radioactive initiators may also be used to retrofit existing coolant apparatus by placing them within the liquid bath of coolant in any two-phase cooling system. The present invention may also utilize an external radiation source which directs radiation toward the coolant to initiate boiling.

BRIEF DESCRIPTION OF THE DRAWINGS

FIG. 1A is an isometric view of a liquid cooling apparatus constructed in accordance with the principles of the invention;

FIG. 1B is an isometric view of the inventive cooling apparatus inserted into an enclosure which holds the apparatus in a vertical orientation;

DETAILED DESCRIPTION OF THE PREFERRED EMBODIMENTS

Figure 2:
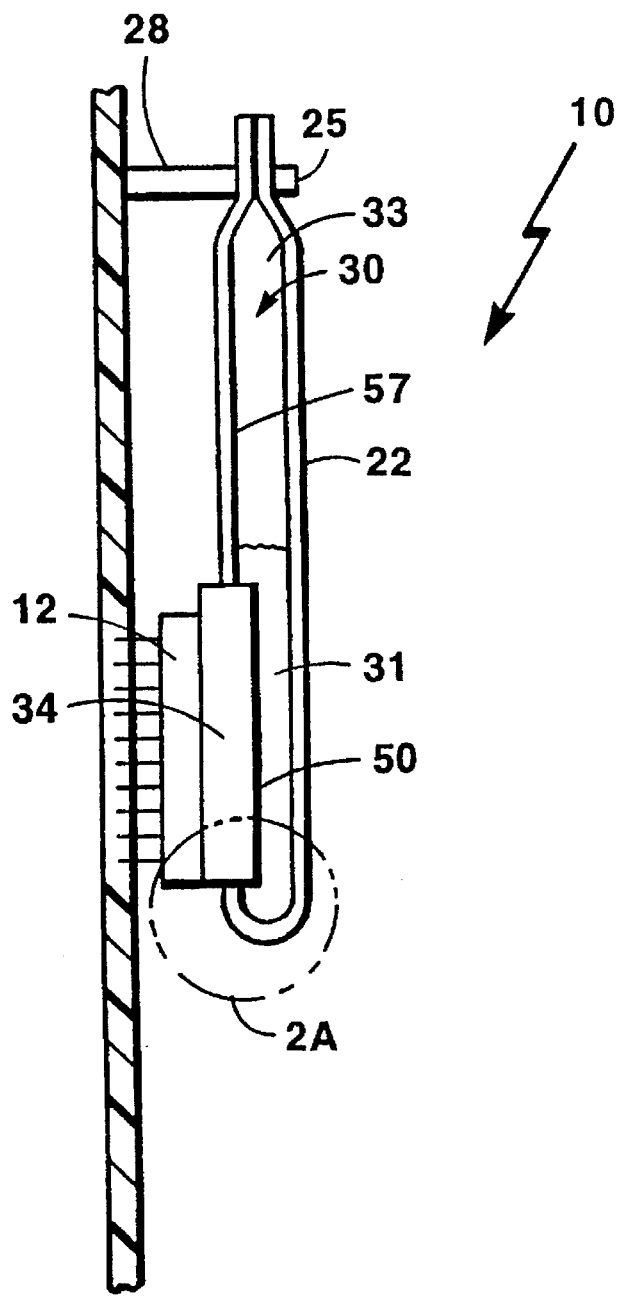
FIG. 2 is a cross-sectional view of the cooling apparatus shown in FIGS. 1A and 1B taken along section line 2—2 shown in FIG. 1A.

FIG. 1A illustrates a heat transfer unit 10 for cooling an electronic component such as an integrated circuit or chip package 12. The integrated circuit component 12 is mounted on a circuit board 14 of the type that is commonly used in computer and other electronic systems.

Component 12 is relatively high-density and may, for example, dissipate 10 watts or more. It may contain many hundreds of thousands of active electronic devices. Most commonly, component 12 is a microprocessor chip or other such highly-sophisticated circuit, but may also consist of several integrated circuits mounted on a heat spreader plate as will hereinafter be described. In addition, component 12 may be a multi-chip module having more than one chip in a single ceramic or plastic package.

Components 16 other than the component 12 are also typically mounted on the circuit board 14. For clarity, FIG. 1A does not show as many additional integrated circuit chips; as are normally included on a typical circuit board. The circuit board 14 includes connectors 18 enabling the component 12 and other components 16 to communicate with circuits on other circuit boards. The circuit board 14 is intended to be mounted in a vertically-oriented position in a circuit board enclosure 15, as shown generally in FIG. 1B, and the circuit board 14 is typically inserted into and extracted from the enclosure 15 using levers 20.

Returning to FIG. 1A, the heat transfer unit 10 comprises a flexible, sealed bag 22 having a lower evaporator portion 25 in contact with the component 12 and an upper condenser portion 23. Heat from the component 12 causes coolant in the evaporator portion 25 to boil and the resulting vapor travels to the upper condenser portion 23 where it condenses. The resulting liquid returns to the evaporator portion 25 by gravity. The bag 22 is shaped to conform to the available space on the circuit board 14 above the component 12, while at the same time having a thin enough profile so as not to interfere with adjacent circuit boards 14 when installed in the enclosure 15 (FIG. 1B).

The bag 22 is typically manufactured separately from the component 12, and is formed of a flexible sheet material which is impermeable to air, other gases, and liquids. The material may be a single or multi-layer plastic film and is usually a type of thermoplastic film, because the latter is readily available and is often heat-sealable. The preferred material for the bag 22 is a multi-layer film formed of a thin aluminum or other metallic layer laminated on both sides with one or more layers of a modified polyethylene teraphthalate (PET) film and is held together with a laminating adhesive. One example of such a multi-layered film is sold as Meals Ready to Eat (MRE) type film by the American National Can Company of Mt. Vernon, Ohio. The bag 22 can also be made of any other similar material which can withstand the normal operating temperature of the components, typically 70–90 degrees centigrade (°C.).

To permit attachment of the bag 22 to the circuit board 14, the periphery 21 of the bag 22 is formed more rigidly than the rest of the bag, and includes holes 24 adapted to receive fasteners such as screws or the like which hold the periphery 21 against standoffs 29 extending from the board 14. The periphery 21 may be formed by heat-sealing the plastic film to form a rigid lip or by heat-sealing or otherwise attaching the plastic film to a rigid frame.

As shown in FIG. 2, a heat spreader plate 34 is located in the bag 22 and contacts the component 12 substantially along one of the major outer surfaces thereof. Plate 34 can be manufactured as an integral part of the component 12 or manufactured separately. The plate 34 may also be in contact with more than one component 12 to provide heat transfer from each of them to the coolant 31 in bag 22. The heat spreader plate 34 provides a high-thermal-conductivity heat transfer path directly from the component 12 to the coolant 31. Thus, the transfer of heat into the coolant 31 is not hindered by any thermal resistance of the bag 22 in areas adjacent the component 12. Moreover, since the plate 34, and not the outer surface of the component 12 contacts the coolant 31, the component 12 need not be compatible with long term exposure to the coolant fluids used within the bag 22.

Figure 2A:
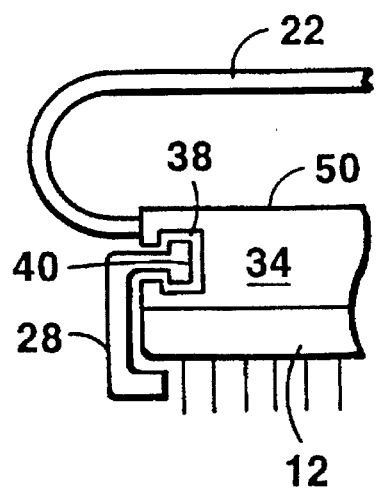
FIG. 2A is a cross-sectional view showing in detail a clip for holding the cooling apparatus in place against a heat-dissipating component.

The heat spreader plate 34 is typically made of a material having high heat conductivity, e.g. copper, diamond-copper composite, aluminum or, in some cases, high-conductivity plastic. The plate 34 may be mounted to the component 12 in any conventional manner including holding it in place against the component 12 using spring clips 28. FIG. 2A is a more detailed view of a preferred C-shaped spring clip 28. A T-shaped channel 38 in the outer periphery of the lower portion of the plate 34 receives the clip 28, which in turn has a T-shaped end 40 adapted to fit into the channel 38. The clip 28 also extends behind the lower edge of the component 12, thereby holding the assembly against the surface of the component. Thermal grease and/or additional compression between the plate 34 and component 12 may be used to enhance heat transfer from the component 12 to the plate 34.

The bag 22 preferably consists of a thermoplastic material such as polyethelene which can be melted so the bag 22 may be heat-sealed directly to the heat spreader plate 34. To insure a reliable heat seal, the plate 34 may be specially treated before heat-sealing is performed. The plate 34 is preferably formed of aluminum which is treated by a conventional anodizing process. However, after the plate 34 has been anodized, the nickel acetate or other sealing solution that is typically applied to seal an anodized surface is not applied. The unsealed, anodized aluminum plate 34 provides a porous surface for better adherence of the bag 22. As shown, the bag 22 is heat-sealed to the side of the plate 34 which contacts the coolant 31. This seal follows the edge of the plate 34 so as to form a "frame" around the edge of the plate 34. In addition to, or as an alternative to, the heat seal, the bag 22 may be affixed to the plate 34 in a compression seal using, for example, a conventional O-ring arrangement.

As shown in the cross-sectional view of FIG. 2, the interior 30 of the bag 22 is substantially filled with a coolant liquid 31. The liquid phase of the coolant 31 typically occupies from 75 to 90 percent of the bag interior 30 when the bag is at room temperature, although the liquid-to-vapor ratio drops significantly as the system reaches operating temperature and the liquid boils. The bag 22 is filled with enough liquid so that the plate 34 is typically immersed in coolant during operation. However, in general, the bag 22 is only partially filled with the liquid coolant, such that at ambient temperature, the volume of coolant 31 is substantially less than the maximum internal capacity of the bag 22. Thus, as the coolant 31 evaporates, the shape of the bag 22 changes and its volume expands without any significant increase in pressure. This helps prevent any significant change in the boiling point of coolant 31.

When initially filled with coolant 31, the bag 22 is not purged of residual gases during manufacture. Instead, residual, non-condensing gases, such as air, are sealed within the system. In this manner, when the component 12 is not operating and is thus at ambient room temperature, the internal pressure of the bag 22 remains close to the ambient environmental pressure, which is typically one atmosphere. As the volume inside the bag 22 increases, the negligible pressure change in the bag 22 prevents the bag from being prone to the long-term leaking problems associated with certain other prior art devices. In addition, as explained below, the residual gases will intermix with the coolant liquid and assist in initiating boiling.

The coolant 31 preferably comprises a liquid (at the ambient environmental temperature) which is thermally conductive, chemically inert, non-toxic, non-ozone-depleting, non-flammable, and thermally stable, and which is also preferably electrically non-conductive to prevent short circuiting of external electronic components should the bag 22 be ruptured for any reason. The thermal stability of the coolant 31 enables it to maintain its physical and chemical properties throughout repetitive thermal cycles of the component 12 during normal use.

Preferred liquids include the well-known Fluorinert™ electronic fluids which are commercially available from the Minnesota Mining and Manufacturing Company of St. Paul, Minn. A coolant which is particularly suitable for use with the invention is Fluorinert™ FC-72 liquid, which has a relatively low boiling: point of approximately 56° C. The boiling point of FC-72 is thus well below the maximum operating temperature range specified of 80–90° C. for the typical component 12. Other coolants 31 which are suitable for use, with the invention include, but are not limited to ethylene chloride, ethyl alcohol, methanol and other chemicals, as long as they exhibit a predictable boiling point over a range of operating temperatures.

While the coolant 31 is boiling and recondensing, the residual gas in the bag typically migrates to the coolest part of the system, that being the top of the bag 22. It remains in this upper region 33 of the bag 22 during the time that the coolant is boiling. If the system is shut down and allowed to cool completely, some of the residual gas will gradually diffuse back into the coolant 31. This diffusion is advantageous in that, as the system begins to heat up again, the residual gas will come out of solution and form nucleation sites which initiate the boiling process in the coolant 31. These sites thus help to alleviate the problem of thermal hysteresis, but tend to only partially reduce overshoot. However, if the system is not allowed to cool completely (i.e. if it is turned on shortly after being turned off), the residual gas has not yet intermixed sufficiently with the coolant to provide a sufficient number of nucleation sites.

Figure 3A:
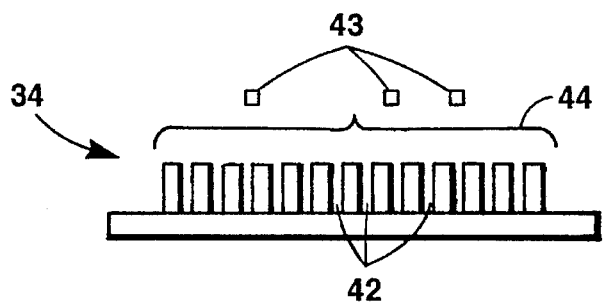
FIG. 3A is an exploded bottom view of the heat spreader plate of FIG. 3.
Figure 3B:
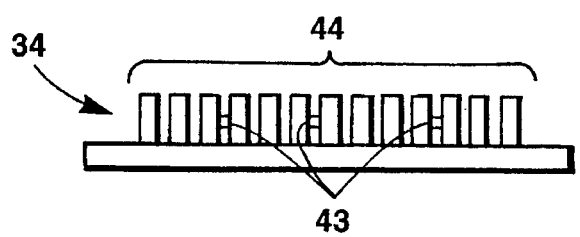
FIG. 3B is an assembled bottom view of the heat spreader plate of FIG. 3.

The present invention reduces the thermal hysteresis of the cooling system by incorporating radioactive material within the coolant 31 to induce the formation of nucleation sites that initiate the boiling process at a temperature close to the coolant boiling point. As shown in FIGS. 3A–3B, the heat spreader plate 34 is provided with slots 42 which are formed in a raised portion 44 of the plate 34. These slots increase the surface area of plate 34. As will be shown more clearly in FIG. 4, slots are also formed in a direction perpendicular to slots 42 to create a lattice of slots across the surface of raised portion 44. This, in effect, creates an array of fins 45 which project into the coolant 31. Positioned within this array of fins 45 are uranium pellets 43 which are submerged in the liquid coolant. FIG. 3A shows the plate 34 and the pellets 43 in an exploded view, while FIG. 3B shows the pellet 43 in place within the fins 45 of the plate 34.

Uranium pellets 43 are pieces of "spent" uranium which is commercially available in the United States. This uranium is most often produced as a waste product in the production of highly radioactive uranium-235, and generally consists of 99.8% uranium-238, with a residual 0.2% uranium-235. In the preferred embodiment, the uranium pellets are cylindrically shaped, being 1/16th inch in diameter and 1/16th inch long. Three such pellets are shown although, obviously, more or fewer pellets may be used. Although spent uranium is the preferred alpha radiation source, any other radiation source may be used including other alpha radiation sources such as an Americium isotope.

In this embodiment, heat spreader plate 34 is oriented vertically as shown in FIG. 2. The fins 45 project into the coolant 31, providing extended surface area for transferring heat from the plate 34 to the coolant 31. At ambient temperature, the top 57 of plate 34 is typically fully submerged in the coolant as shown in FIG. 2. However, during boiling, the top several rows of fins 45 may be above the liquid level of the coolant due to the increased phase change of the coolant from liquid to vapor. Accordingly, the uranium pellets 43 are preferably located in the lower rows of fins 45 and so are always immersed, and are spaced out somewhat equally across the width of the fin array. This location of the pellets 43 is also beneficial in that "bubble-washing" occurs on most of the surface of plate 43. That is, as the bubbles from the initiated boiling sites move toward the surface of the liquid, they "wash over" much of the surface, helping to induce the formation of nucleation sites in other locations. By locating the pellets 43 near the bottom of the liquid region, the bubbles from the induced nucleation sites wash over a large surface area of the plate 34.

Figure 4:
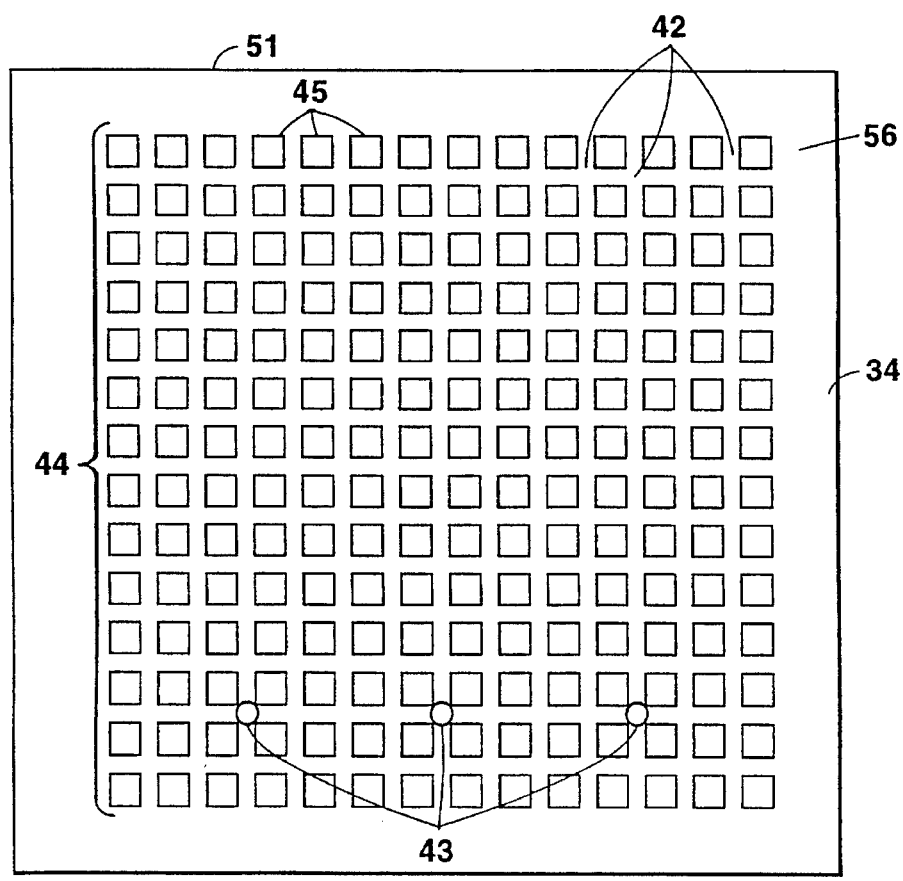
FIG. 4 is a front view of a heat spreader plate.

As shown in FIG. 4, the pellets 43 are preferably located vertically above the second row of fins 45 and are somewhat equally spaced horizontally between the columns of fins 45. When inserted between the fins 45 of the plate 34, each of the pellets 43 is located in a space formed by four fins 45, each of which contacts the pellet from a different direction. This provides firm engagement between each pellet and its four surrounding fins, preventing the pellet 43 from becoming dislodged. The pellets, of course, may alternatively be attached to plate 34 or to bag 22 in any conventional manner. For example, the pellets 43 may be secured to the plate by heat sealing them in place using a thermoplastic material, which may be accomplished during the heat sealing process of attaching the bag 22 to the plate 34. The pellets might also be heat-sealed directly to the surface of the bag.

The uranium continuously decays and emits alpha particles which collide with the heavy molecules of the coolant 31. The alpha particles thus impart energy to these molecules, creating localized regions of superheating which act as nucleation sites to initiate boiling of the coolant 31. This phenomenon is similar to the operation of bubble chambers in particle accelerators to detect the presence and trajectories of high energy particles through their interaction with superheated fluids.

Without the initiation of coolant boiling by the inducement of nucleation sites, overshoots of as much as 15–20° C. have been experimentally observed. Testing with radioactive initiators of the present invention has provided a reduction in the average overshoot to about 3–4° C. Even greater reduction can be expected from modification of the design of the spreader plate 34, the implementation of the radioactive source and the type of radioactive material itself.

Figure 5:
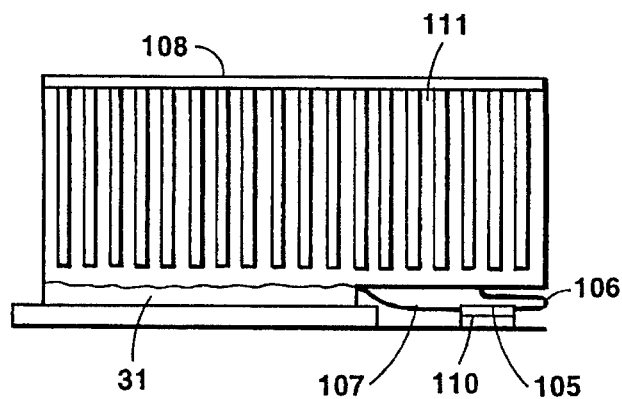
FIG. 5 is an overview of an alternative embodiment of a cooling apparatus of the present invention.

FIG. 5 depicts an embodiment of the invention for use when the surface to be cooled is horizontally disposed. A two-phase cooling system uses an evaporator unit 105 which is in thermal contact with an electrical component 110. The evaporator unit 105 is in fluid communication with a condenser unit 108 via coolant return tube 107 and vapor tube 106. As component 110 increases in temperature, the coolant 31 within the evaporator 105 begins to boil and the vapor travels up vapor tube 106. The vapor is dispersed within the fins 111 of condenser 108, is cooled by air flow along the fins 111, and recondenses. The coolant 31 travels by gravity down into the pool of coolant 31 in the base of condenser 108. Coolant 31 then returns to the evaporator 105 through return tube 107.

The condenser 108 of FIG. 5 has narrow fins 111 along its length. The entire condenser unit 108 is narrow, allowing it to be deployed in an unused expansion slot of a computer, which is likely to have high density integrated circuit components which need cooling. The evaporator unit 105 may be in contact with a component 110 located away from condenser unit 108, but still be in fluid contact with the condenser via tubes 106, 107.

Figure 6A:
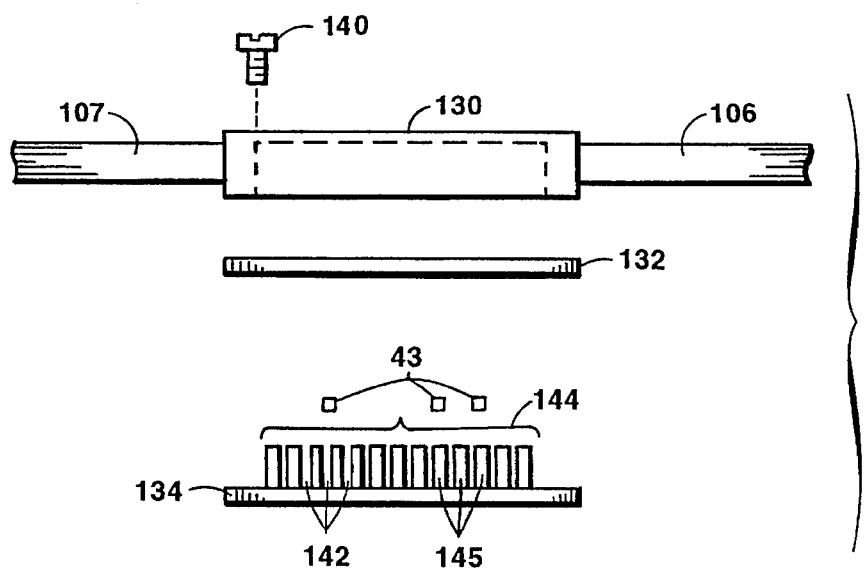
FIG. 6A is an exploded view of an evaporator unit of the cooling apparatus of FIG. 5.

The evaporator unit 105 of the FIG. 5 embodiment is shown in exploded view in FIG. 6A. It includes a heat spreader plate 134, and O-ring seal 132 and an evaporator cover 130. The plate 134 is secured to the evaporator cover 130 by screws 140, and an airtight seal is formed therebetween by O-ring 132. Plate 134 is substantially identical to plate 34 of the FIG. 3 embodiment, although variations in the fin structure and the overall size of the plate 134 may exist to accommodate the specifics of this embodiment. The slots 142 formed in the raised portion 144 of heat spreader plate 134 create the fins 145 which will transfer heat directly to the coolant fluid passing through the evaporator 105.

As in the embodiment of FIGS. 1–4, spent uranium pellets 43 are wedged between the fins of plate 134. Pellets 43 are shown separated from plate 134 in the exploded view of FIG. 6A, but are integral with the fins of the plate 134 in the view of FIG. 6B, in which the evaporator 105 is shown assembled. Because the evaporator unit 105 is located such that fins 145 are oriented vertically, the uranium pellets are spaced about the array of fins 145 to best cover the area covered by the coolant liquid. In this embodiment, four pellets are used and each positioned in the vicinity of one of the four corners of the fin array. This distribution of pellets is depicted in the top view of plate 134 shown in FIG. 7. If the evaporator unit were to be oriented such that the fins 145 were horizontal, as in the previous embodiment, the uranium pellets 43 would instead be located in the positions shown in FIG. 3.

This embodiment of the invention functions in essentially the same manner as the embodiment of FIGS. 1–4. Thus, heat is transferred to heat spreader plate 134, it is in turn transferred to the coolant 31. As the coolant 31 reaches its boiling point, alpha particles given off by uranium pellets 43 induce the formation of nucleation sites which initiate boiling and reduce the temperature overshoot found in prior art systems.

In one alternative arrangement, the radioactive material may be plated on a surface in a region where the coolant 31 boils, e.g. on the spreader plate 34 or 134. This contacts a large surface of radioactive material with the heated coolant 31. While the pellet embodiment has the advantage of being easier to retrofit to existing cooling systems, this embodiment provides better interaction between the radiation from the radioactive source and the coolant fluid, as is described below.

Thus, for a system using a flexible bag, the heat spreader plate 34 shown in FIG. 3 may be plated over its entire surface with a radioactive material such as spent uranium. Any conventional plating technique may be used to apply this radioactive material to the surface of heat spreader plate 34, and the result is a very thin layer of radioactive material across the entire surface of the plate 34. This is particularly effective since, with pellets 43, only the exterior layer of each pellet actually emits radiation into the coolant 31, the radiation from the interior of the pellets being absorbed by the uranium itself. The plated layer allows interaction between the emitted alpha radiation with all of the coolant 31 which contacts spreader plate 34. Thus, the incidence of nucleation sites for initiating boiling of the coolant 31 is also increased.

Figure 6B:
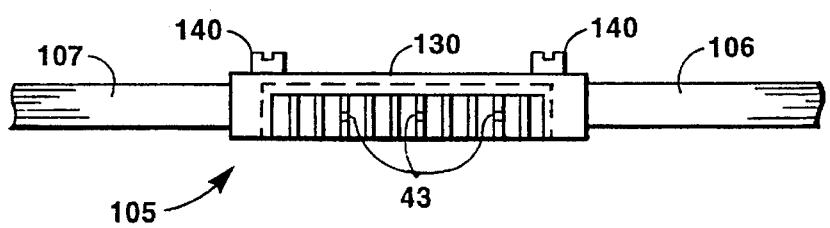
FIG. 6B is an assembled view of the evaporator unit of FIG. 6A.
Figure 7:
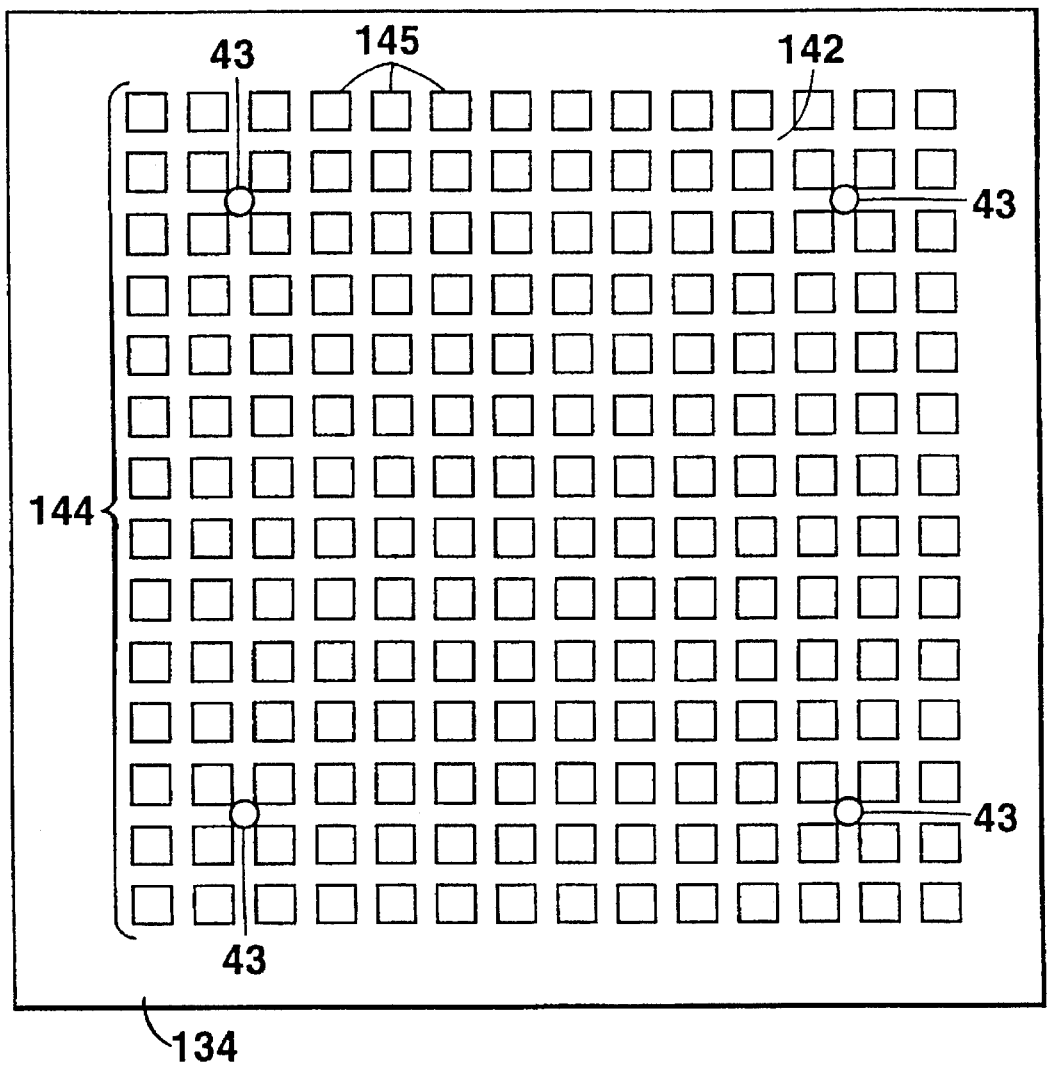
FIG. 7 is a plan view of a heat spreader plate of the evaporator unit of FIG. 6A.

With regard to the apparatus shown in FIGS. 6A, 6B and 7, both the heat spreader plate 134 and the evaporator cover 130 can be plated with the radioactive material. Thus, the liquid coolant present in the evaporator unit 105 is completely surrounded by uranium which emits alpha radiation into the coolant from nearly all directions. Just as with the uranium-plated spreader plate 34 of FIG. 3, this provides a greatly increased incidence of nucleation sites, and thus a much quicker initiation of boiling.

In another alternative embodiment, a shielding material is provided between the radiation sources and the unit being cooled. This prevents any interaction between the radiation emitted and the unit, which may be an integrated circuit. For example, in FIG. 4, the heat spreader plate 34 may be coated with a radiation absorbing material such as tungsten or molybdenum. This material would then prevent unwanted interaction between the radiation and the component 12. This coating procedure can also be combined with any of the previous embodiments.

In still another alternative embodiment, the radiation source is located outside of the region enclosing the liquid coolant 31. For example, one or more radioactive pellets might be attached to the external surface of the bag 22 or evaporator unit 105 in the embodiments of FIGS. 1–4 and FIGS. 5–7, respectively. Because of the difficulty of alpha radiation penetrating the surface of the coolant container, a radiation source of beta, gamma or neutron radiation is preferred for this embodiment.

It will be understood by those skilled in the art that variations of this sort are a matter of degree and not outside the scope of the claimed invention. For example, the preferred embodiment uses spent uranium as a radioactive source because of the relatively low energy of the alpha particles which are released during its decay. Because of this low energy, most of the particles are likely to be absorbed, rather than escape the coolant enclosure. However, other types of radiation would also improve the nucleation process and are considered to be within the scope of the present invention. Furthermore, it is not necessary that the radioactive source be used in connection with a heat spreader plate, but may be used in any two-phase cooling system, provided the coolant liquid is exposed to the radiation of the radioactive source in a region where it is to boil. The radioactive initiator may also be combined with other techniques for inducing the formation of nucleation sites, such as the mixing of other fluids with the coolant liquid.

What is claimed is:

1. A two-phase cooling apparatus for cooling a unit to be cooled, the apparatus comprising:

a container;

a coolant liquid contained in the container in thermal contact with the unit to be cooled, whereby a portion of the liquid is vaporized from absorption of heat from the unit; and a radioactive source which emits radiation that interacts with the liquid.

2. A cooling apparatus according to claim 1 wherein the liquid boils substantially at a normal operating temperature of the unit to be cooled.

3. A cooling apparatus according to claim 2 wherein the liquid is a fully perfluorinated fluorocarbon.

4. A cooling apparatus according to claim 1 wherein the container is a flexible sealed bag.

5. A cooling apparatus according to claim 1 further comprising a heat spreader plate having a high thermal conductivity which provides a thermal conduction path between the liquid and the unit to be cooled.

6. A cooling apparatus according to claim 5 wherein the heat spreader plate is at least partially submerged in the liquid.

7. A cooling apparatus according to claim 5 wherein the heat spreader plate comprises an array of fins which contact the coolant liquid.

8. A cooling apparatus according to claim 5 wherein the radioactive source is rigidly secured to the container.

9. A cooling apparatus according to claim 8 wherein the radioactive source is secured to the heat spreader plate with an adhesive material.

10. A cooling apparatus according to claim 8 wherein the radioactive source is plated onto the heat spreader plate.

11. A cooling apparatus according to claim 1 wherein the liquid is thermally conductive and electrically non-conductive.

12. A cooling apparatus according to claim 1 wherein the container comprises a condenser region within which vaporized coolant recondenses.

13. A cooling apparatus according to claim 1 wherein the radioactive source comprises a uranium isotope.

14. A cooling apparatus according to claim 1 wherein the radioactive source comprises uranium-238.

15. A cooling apparatus according to claim 1 wherein the radioactive source emits alpha radiation.

16. A cooling apparatus according to claim 1 wherein the interaction of the radiation with the liquid induces the formation of boiling nucleation sites.

17. A cooling apparatus according to claim 1 wherein the radioactive source comprises a plurality of radioactive sources which are distributed throughout the enclosed region.

18. A cooling apparatus according to claim 17 wherein the radioactive sources are equally spaced from one another in the enclosed region.

19. A cooling apparatus according to claim 17 wherein the radioactive sources are all submerged in the liquid during operation of the apparatus.

20. A cooling apparatus according to claim 1 wherein the container comprises:

an evaporator unit within which the radioactive source is located; and a condenser unit in fluid communication with the evaporator unit.

21. A cooling apparatus according to claim 20 further comprising a heat spreader plate located within the evaporator unit which transfers heat from the unit to be cooled to the liquid.

22. A cooling apparatus according to claim 1 wherein the radioactive source is integral with an inner surface of the container.

23. A cooling apparatus according to claim 22 wherein the radioactive source is plated onto the inner surface of the evaporator unit.

24. A cooling apparatus according to claim 1 wherein the unit to be cooled is an electronic component.

25. A cooling apparatus according to claim 1 further comprising a radiation shield between the unit to be cooled and the radioactive source.

26. A cooling apparatus according to claim 25 wherein the radiation shield is coated on a surface of the container.

27. A cooling apparatus according to claim 25 wherein the radiation shield comprises a radiation-absorbing material.

28. A cooling apparatus according to claim 1 wherein the radioactive source is located outside the container.

29. A cooling apparatus according to claim 28 wherein the radioactive source comprises a source selected from the group consisting of a beta radiation source, a gamma radiation source and a neutron radiation source.

30. A two-phase cooling apparatus for cooling a unit to be cooled, the apparatus comprising:

a container;

a coolant liquid contained in the container in thermal contact with the unit to be cooled, whereby a portion of the liquid is vaporized from absorption of heat from the unit;

a heat spreader plate having a high thermal conductivity providing a thermal conduction path from the unit to be cooled to the liquid; and a radioactive source which emits radiation that interacts with the liquid.

31. A cooling apparatus according to claim 30 wherein the container is a flexible sealed bag.

32. A cooling apparatus according to claim 30 wherein the container comprises:

an evaporator unit; and a condenser unit in fluid communication with the evaporator unit.

33. A cooling apparatus according to claim 30 wherein the radioactive source is a uranium isotope.

34. A cooling apparatus according to claim 30 wherein the radioactive source is plated to an inner surface of the container.

35. A two-phase cooling apparatus for cooling an electronic component, the apparatus comprising:

a flexible sealed bag;

a coolant liquid contained in the bag in thermal contact with the component, whereby a portion of the liquid is vaporized from absorption of heat from the component;

a heat spreader plate located within the bag and having a high thermal conductivity which provides a thermal conduction path between the liquid and the component; and a radioactive source which emits radiation that interacts with the liquid.

36. A method of improving a two-phase cooling apparatus having a liquid contained in a container in thermal contact with a unit to be cooled, whereby a portion of the liquid is vaporized from absorption of heat from the unit, the method comprising:

providing a radioactive source which emits radiation that interacts with the liquid.

37. A method according to claim 36 wherein the liquid boils at a normal operating temperature of the unit to be cooled.

38. A method according to claim 36 wherein the container is a flexible sealed bag.

39. A method according to claim 36 wherein the container comprises an evaporator unit and a condenser unit in fluid communication with the evaporator unit.

40. A method according to claim 36 wherein the apparatus includes a heat spreader plate having a high thermal conductivity which provides a thermal conduction path between the liquid and the unit to be cooled.

41. A method according to claim 36 wherein the liquid is thermally conductive and electrically non-conductive.

42. A method according to claim 36 wherein providing a radioactive source comprises providing a uranium isotope.

43. A method according to claim 36 wherein providing a radioactive source comprises providing a radioactive source which, by emitting radiation, induces the formation of boiling nucleation sites.

44. A method according to claim 36 wherein providing a radioactive source comprises providing a plurality of radioactive sources which are distributed throughout the container.

45. A method according to claim 36 wherein providing a radioactive source comprises coating an inner surface of the container with the radioactive source.

46. A method according to claim 45 wherein coating an inner surface of the container comprises plating the radioactive source onto the inner surface.

47. A method of improving a two-phase cooling apparatus having a coolant liquid contained in a container in thermal contact with a unit to be cooled, whereby a portion of the liquid is vaporized from absorption of heat from the unit, the method comprising:

distributing radioactive material within the container that emits radiation which interacts with the liquid to induce the formation of boiling nucleation sites.

* * * * *